United States Patent [19]

Baliga

[11] 4,236,947

[45] Dec. 2, 1980

[54] FABRICATION OF GROWN-IN P-N JUNCTIONS USING LIQUID PHASE EPITAXIAL GROWTH OF SILICON

[75] Inventor: Bantval J. Baliga, Clifton Park, N.Y.

[73] Assignee: General Electric Company, Schenectady, N.Y.

[21] Appl. No.: 40,643

[22] Filed: May 21, 1979

[51] Int. Cl.³ .......................................... H01L 21/208
[52] U.S. Cl. ..................................... 148/171; 148/172
[58] Field of Search ............................... 148/171, 172

[56] References Cited

U.S. PATENT DOCUMENTS

| | | | |
|---|---|---|---|
| 3,530,011 | 9/1970 | Suzuki et al. | 148/171 X |
| 3,565,702 | 2/1971 | Nelson | 148/172 |
| 3,632,431 | 9/1972 | Andre | 148/171 X |
| 3,647,578 | 3/1972 | Barnett et al. | 148/171 |
| 3,783,825 | 1/1974 | Kobayasi | 148/171 X |
| 4,128,440 | 12/1978 | Baliga | 148/171 |

OTHER PUBLICATIONS

Baliga, *J. of Electrochem. Soc.*, vol. 124, No. 10, Oct. 1977, pp. 1627-1631.

*Primary Examiner*—G. Ozaki
*Attorney, Agent, or Firm*—Marvin Snyder; James C. Davis

[57] ABSTRACT

High quality p-n junctions are formed in silicon grown epitaxially onto a silicon substrate of one conductivity type from a melt undersaturated with silicon and containing opposite conductivity type determining impurities. Lowering the substrate into the melt causes same of the substrate dopant to enter the melt. With a substrate doping level exceeding that of the epitaxial layer that would grow in the absence of meltback, the epitaxial layer initially grows with the one conductivity type. However, as epitaxial layer thickness increases, the substrate dopant atoms in the melt are consumed and the epitaxial layer grown thereafter is of opposite conductivity type, producing a p-n junction in the epitaxial layer away from the substrate.

8 Claims, 3 Drawing Figures

FABRICATION OF GROWN-IN P-N JUNCTIONS USING LIQUID PHASE EPITAXIAL GROWTH OF SILICON

INTRODUCTION

This invention relates to semiconductor device fabrication procedures, and more particularly to a method of employing a liquid phase epitaxial process to produce a high-quality p-n junction in the epitaxially-grown silicon.

In B. J. Baliga application Ser. No. 899,119, filed Apr. 24, 1978, now U.S. Pat. No. 4,191,602 and assigned to the instant assignee, a method of making a high-power, vertical channel field effect transistor with a buried grid by use of liquid phase epitaxial deposition of silicon is described and claimed. This epitaxial growth of silicon from the liquid phase can be used to provide advantageous semiconductor device fabrication results, in comparison with the more common epitaxial growth of silicon from the vapor phase.

The liquid phase epitaxial growth of high resistivity silicon layers with high minority carrier lifetime requires that the solvent for the silicon to be grown not introduce active centers in the silicon lattice. A solvent useful for this purpose is tin, since tin and silicon are in the same column in the Periodic Table so that incorporation of tin into the silicon lattice introduces neither shallow dopant levels nor deep-lying recombination levels in the silicon energy gap.

The quality of p-n junctions fabricated using silicon liquid phase epitaxy with tin as the solvent is an important factor in evaluating their potential for electronic device applications. By incorporating a high concentration of tin in the epitaxially-grown layers, it may be expected that deep recombination levels would be introduced thereby, thus degrading the quality of the p-n junctions formed in the device. Nevertheless, by utilizing the present invention, a high minority carrier lifetime can be measured in the epitaxially-grown layers, indicating that the presence of tin therein does not introduce a large density of recombination centers in the silicon. Moreover, by employing meltback prior to epitaxial growth, the crystalline quality of the epitaxial growth is improved because the meltback provides an in situ substrate surface cleaning prior to growth.

Accordingly, one object of the invention is to form high quality p-n junctions in layers grown by liquid phase epitaxy.

Another object is to form high quality p-n junctions in epitaxially-grown layers at a distance from the substrate-epitaxial layer interface.

Another object is to provide a technique employing meltback in forming a junction diode in a silicon layer grown epitaxially from the liquid phase on a p-type silicon substrate, with a graded p-type region at the substrate-epitaxial layer interface.

Briefly, in accordance with a preferred embodiment of the invention, a method of forming a high quality p-n junction in epitaxially-grown silicon comprises the steps of maintaining at growth temperature a tin melt saturated with silicon containing n-type dopant atoms, heating a silicon substrate of p-type conductivity to a temperature above the growth temperature, and immersing the substrate heated above the growth temperature into the melt heated to growth temperature. The melt temperature is then reduced at a controlled rate to induce epitaxial growth of silicon on the substrate.

In accordance with another preferred embodiment of the invention, a method of forming a high quality p-n junction in epitaxially-grown silicon comprises the steps of maintaining at growth temperature a tin melt containing less than the saturation volume of silicon together with n-type dopant atoms, heating a silicon substrate of p-type conductivity to the growth temperature, and immersing the substrate heated at the growth temperature into the melt heated to growth temperature. The melt temperature is then reduced at a controlled rate to induce epitaxial growth of silicon on the substrate.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1:
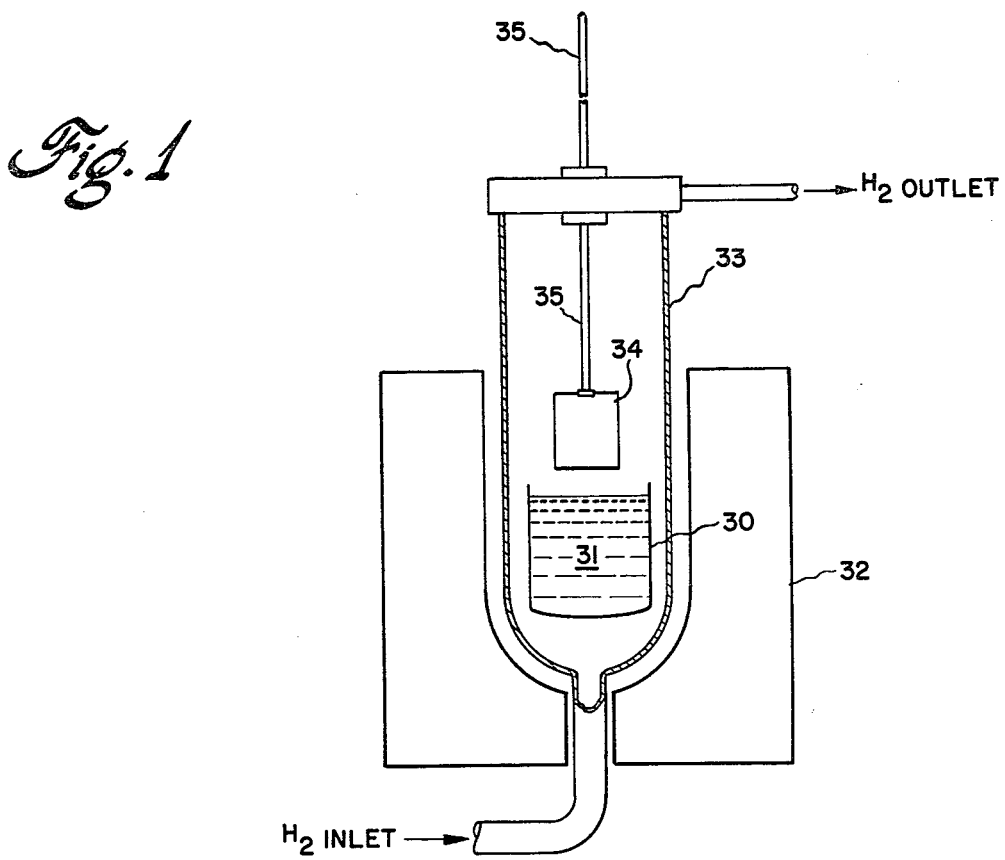
FIG. 1 is a schematic diagram of apparatus employed in practicing the instant invention.

The liquid phase epitaxial process is typically performed using apparatus of the type shown schematically in FIG. 1, and described in B. J. Baliga U.S. Pat. No. 4,128,440, issued Dec. 5, 1978 and assigned to the instant assignee. The epitaxial layers are grown by using the well-known dipping technique, with tin as a solvent for the silicon. A crucible 30, containing a tin melt 31 in which is dissolved a dopant for establishing a predetermined conductivity-type silicon is heated in a reducing atmosphere. For epitaxially depositing a silicon layer containing n-type impurities, a melt of high purity tin is preferably employed, heated to the growth temperature of 950° C. in a hydrogen atmosphere in a resistance furnace 32. The crucible is preferably contained in a quartz tube 33 with the flow of hydrogen gas, as illustrated by the arrows of FIG. 1, preferably being from the bottom of tube 33 toward the top. A wafer holder 34, preferably made of quartz, is attached to a vertical rod 35, also preferably fabricated of quartz, which raises and lowers holder 34.

Prior to growth, tin melt 31 is undersaturated with silicon from a phosphorus-doped float zone silicon wafer of resistivity in excess of 100 ohm-cm, dipped therein by holder 34. While the silicon is being dissolved in the melt, the melt is preferably stirred by oscillation of holder 34 about a vertical axis. Addition of silicon is continued while monitoring the quantity being added, until any desired amount below the solubility limit of silicon in tin is dissolved into the melt at the growth temperature. After each epitaxial growth, the silicon in the melt is preferably replenished using the same procedure.

The epitaxial layer may typically be grown on a (111) oriented, 0.01 ohm-cm, boron-dipped silicon substrate. The substrate wafer is dipped in dilute hydrofluoric acid just before loading into wafer holder 34. The substrate wafer temperature is brought up to the melt temperature by holding the wafer above the melt for about 10 minutes. The wafer is thereafter inserted into the melt, and the melt temperature is lowered at a controlled cooling rate which may range from 0.2° to 7° C. per minute. After epitaxial growth, the wafer is removed from the melt and etched in aqua regia to remove any tin that may have adhered to the wafer surface.

Figure 2:
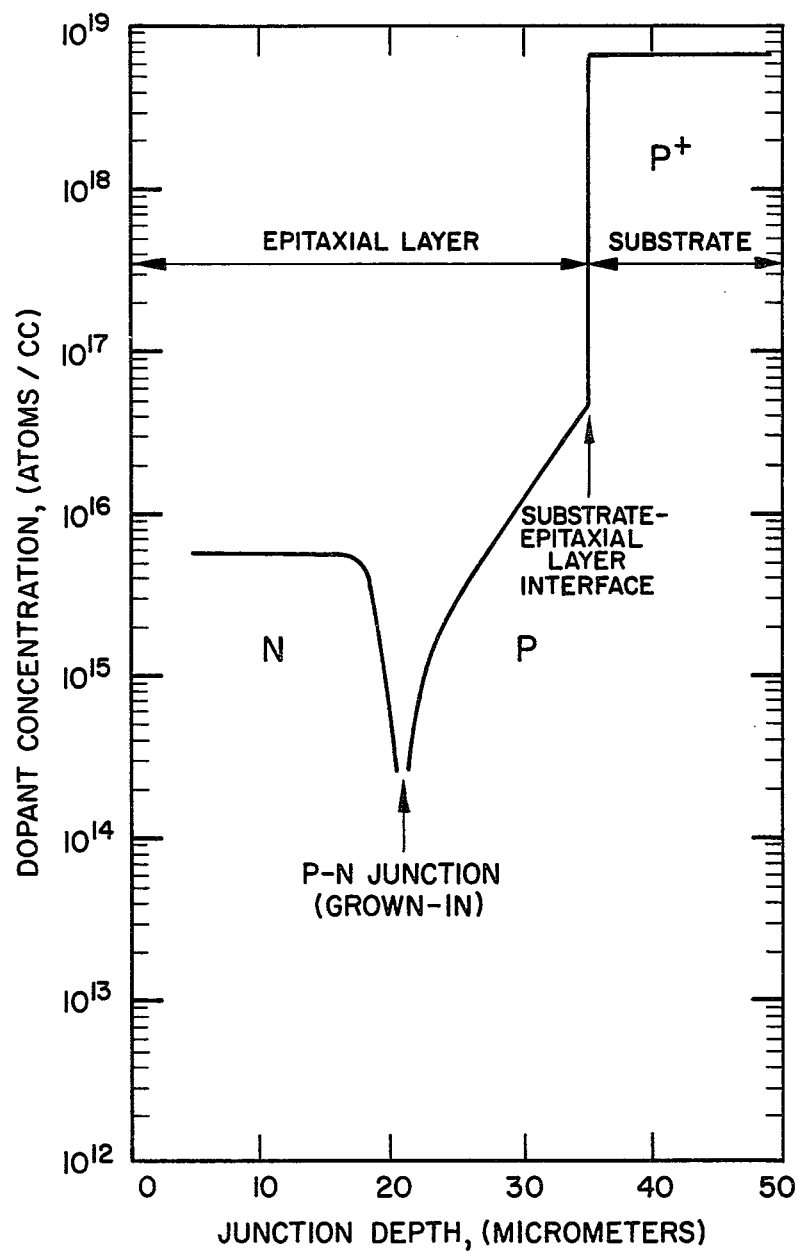
FIG. 2 is a doping profile of a device formed by practicing the instant invention.

Because the melt is undersaturated at the temperature at which the substrate wafer is introduced therein, meltback of the substrate occurs prior to epitaxial growth. That is, tin penetrates into the silicon substrate. In the presence of meltback prior to growth, a graded p-type layer is observed at the interface between the epitaxially-grown layer and the substrate. As illustrated in the doping profile shown in FIG. 2, the doping concentration decreases exponentially with distance away from the interface between the epitaxially-grown layer and the substrate, until a p-n junction is formed. The reason for this temperature profile is as follows.

Being that the melt is initially undersaturated at the time the substrate is introduced therein, some of the substrate, together with the substrate dopant therein, dissolves into the melt. When epitaxial growth then commences, the dopant atoms are incorporated into the layer being grown epitaxially. By making the substrate doping level higher than that of the epitaxial layer that would be grown in the absence of meltback, and of opposite conductivity type, the epitaxial layer is formed initially with the same conductivity type as the substrate; that is, the epitaxial layer close to the substrate is of p-type conductivity. However, as the epitaxial layer thickness increases, the substrate dopant atoms released into the melt by meltback are completely consumed, and the epitaxial layer then becomes of opposite conductivity type. As a result, a p-n junction is formed within the epitaxial layer at a distance from the interface between the substrate and the epitaxial layer. The graded p-type layer between the interface and the p-n junction is the result of the boron dopant concentration decreasing exponentially with distance away from the interface.

By starting with a tin melt undersaturated by 5° C., and a melt cooling rate of 7° C. per minute immediately after substrate immersion into the melt, a grown-in p-n junction occurs 14 micrometers away from the substrate-epitaxial layer interface. The occurrence of the junction can be varied by employing other degrees of undersaturation and cooling rate of the melt.

As an alternative method of practicing the instant invention, tin melt 31 may be initially saturated with silicon from the phosphorus-doped float zone silicon wafer of resistivity in excess of 100 ohm-cm, dipped therein by holder 34. Again, during saturation, the melt is preferably stirred by oscillation of holder 34 about a vertical axis. The saturation is conducted until no further loss in weight of the saturation wafer can be detected. A fresh 99 gram tin melt at 950° C. can be saturated by 0.47 grams of silicon.

The boron-doped silicon substrate wafer, after being dipped in dilute hydrofluoric acid, is loaded into wafer holder 34 and heated to a temperature above the melt temperature, such as 955° C., by positioning the wafer at a higher temperature zone in furnace 32 than the zone in which crucible 30 is situated. The wafer is thereafter inserted into the melt and the melt temperature lowered at a controlled cooling rate of between 0.2° and 7° C. per minute. Because the substrate is hotter than the melt at the time it is immersed therein, it locally heats the melt, causing some meltback due to the increase in silicon solubility with increasing temperature. Again, therefore, with meltback some of the substrate dopant enters into the melt and, when epitaxial growth commences, these dopant atoms are incorporated into the epitaxial layer. Therefore, a graded p-type layer is again observed at the interface between the epitaxial layer and the substrate.

The devices formed by either procedure may be fabricated into diodes by first performing a phosphorus diffusion into the epitaxial layer to obtain a good ohmic contact. Aluminum may then be evaporated onto both sides of the wafer, and the wafer sintered at 400° C. for 30 minutes. The wafer may then be scribed apart into chips of 60 mils × 60 mils, and mounted on TO-5 headers. After bonding a gold lead to the top surface, the edges of the chips can be etched in a freon plasma just prior to passivation. This method of mounting and passivation is successful in reducing the surface electric field to an extent that allows observation of bulk diode characteristics.

Figure 3:
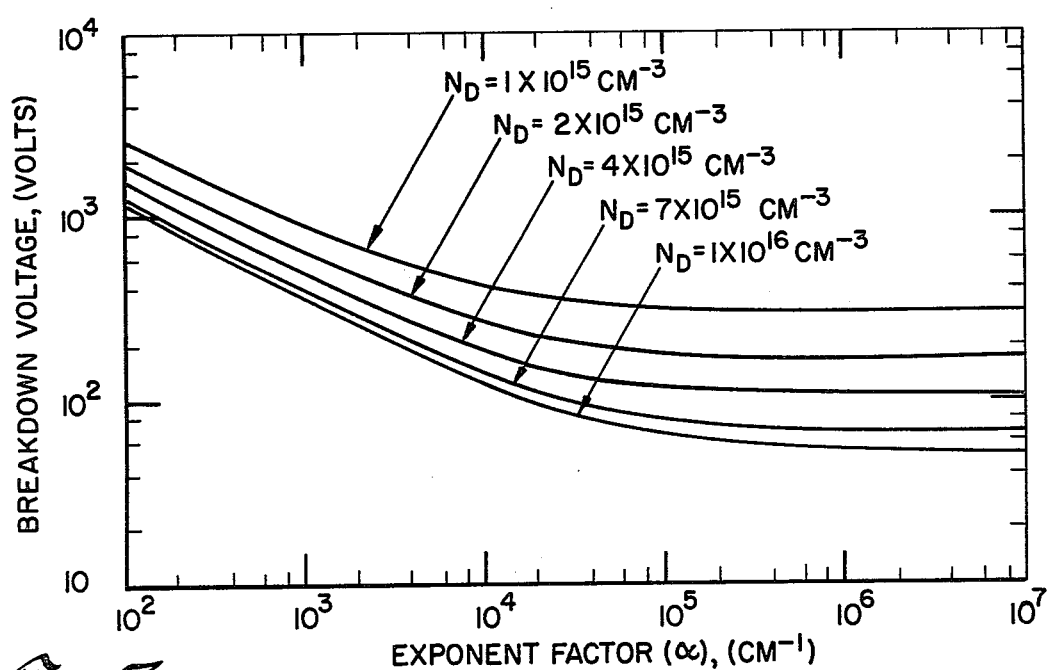
FIG. 3 is a group of curves illustrating theoretical junction breakdown voltage as a function of the exponent factor and the background doping level.

The quality of diodes grown in the presence of meltback is high because the junction is located within the epitaxial layer and away from the interface between the substrate and epitaxial layer. The grading of the doping concentration on the p-type side of the junction enhances the breakdown voltage. This is evident from the family of curves shown in FIG. 3, wherein the breakdown voltage is plotted against exponent factor $\alpha$ for various doping concentrations $N_D$. Exponent factor $\alpha$ may be determined from the expression $$N_A = N_D \exp(\alpha X)$$

where $N_A$ is the acceptor concentration (e.g. boron), $N_D$ is the background donor concentration in the epitaxial layer in the absence of meltback, and X is distance measured from the grown-in junction inwardly toward the substrate. FIG. 3 shows that as $\alpha$ decreases, the breakdown voltage of the diode thus formed increases, for any given level of $N_D$. This is a direct result of the graded doping concentration on the p-type side of the junction. Moreover, the breakdown voltage of the diode formed in this manner is insensitive to the cooling rate of the melt and hence to the rate at which the epitaxial layer is grown. This is evident from the following table of diode breakdown voltages obtained experimentally from seven different diode samples fabricated in the manner described herein.

| Sample No. | Cooling Rate (°C./min) | Exponent Factor ($\alpha$) (cm$^{-1}$) | $N_D$ (cm$^{-3}$) | Breakdown Voltage at Room Temperature (Volts) |
|---|---|---|---|---|
| 1 | 0.2 | $1.0 \times 10^3$ | $6 \times 10^{15}$ | 150 |
| 2 | 2 | $1.5 \times 10^3$ | $3 \times 10^{15}$ | 120 |
| 3 | 0.5 | $2.3 \times 10^3$ | $7 \times 10^{15}$ | 160 |
| 4 | 7 | $2.4 \times 10^3$ | $6 \times 10^{15}$ | 80 |
| 5 | 7 | $1.5 \times 10^4$ | $8 \times 10^{15}$ | 70 |
| 6 | 0.75 | $1.0 \times 10^5$ | $5 \times 10^{15}$ | 50 |
| 7 | 0.2 | $1.0 \times 10^5$ | $1 \times 10^{16}$ | 50 |

Thus an exponentially graded junction diode can be fabricated by the growth of n-type layers on heavily boron-doped substrates by using silicon liquid phase epitaxy with tin as the solvent. By creating a graded junction through use of meltback prior to epitaxial growth, a high breakdown voltage can be achieved. In addition, the minority carrier lifetime in the epitaxial layers is relatively high, indicating that the tin in the layers does not introduce a high concentration of recombination levels in the silicon energy gap.

The foregoing describes a method of forming high quality p-n junctions in layers grown by liquid phase epitaxy. These junctions are formed at a distance from the substrate-epitaxial layer interface. A meltback technique is employed in forming a junction diode in an n-type layer grown epitaxially from the liquid phase on a p-type substrate, with a graded p-type region at the substrate-epitaxial layer interface.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. A method of forming a high quality p-n junction in silicon epitaxially-grown on a substrate, with a graded p-type region situated between said junction and said substrate, said method comprising:
    maintaining at silicon epitaxial growth temperature a tin melt saturated with silicon containing n-type dopant atoms;
    heating a silicon substrate wafer of p-type conductivity to a temperature above the growth temperature;
    immersing the substrate wafer heated above the growth temperature into the melt heated to the growth temperature; and
    reducing the melt temperature at a controlled rate to induce epitaxial growth of silicon on the substrate wafer.

2. The method of claim 1 wherein said melt comprises tin at a temperature of approximately 950° C. when said silicon substrate wafer is initially immersed therein.

3. The method of claim 2 wherein said silicon substrate wafer is heated to a temperature of approximately 955° C. prior to immersion into said melt.

4. The method of claim 3 wherein the controlled rate at which said melt temperature is reduced is in the range of 0.2° C. per minute to 7° C. per minute.

5. A method of forming a high quality p-n junction in silicon epitaxially-grown on a substrate, with a graded p-type region situated between said junction and said substrate, said method comprising the steps of:
    maintaining at silicon epitaxial growth temperature a tin melt containing less than the saturation volume of silicon, said silicon containing n-type dopant atoms;
    heating a silicon substrate wafer of p-type conductivity to said growth temperature;
    immersing said silicon substrate wafer heated at said growth temperature into said melt heated to said growth temperature; and
    reducing the melt temperature at a controlled rate to reduce epitaxial growth of silicon on said silicon substrate wafer.

6. The method of claim 5 wherein said melt temperature comprises tin at a temperature of approximately 950° C. when said silicon substrate wafer is initially immersed therein.

7. The method of claim 6 wherein said silicon wafer is heated to a temperature of approximately 950° C. prior to immersion into said melt.

8. The method of claim 7 wherein the controlled rate at which said melt temperature is reduced is in the range of 0.2° C. per minute to 7° C. per minute.

* * * * *